(12) United States Patent
Kim et al.

(10) Patent No.: US 12,429,522 B2
(45) Date of Patent: Sep. 30, 2025

(54) RELAY DIAGNOSIS DEVICE AND RELAY DIAGNOSIS METHOD

(71) Applicant: LG ENERGY SOLUTION, LTD., Seoul (KR)

(72) Inventors: Hansol Kim, Daejeon (KR); Lyang Wook Jo, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 0 days.

(21) Appl. No.: 18/273,713

(22) PCT Filed: Sep. 19, 2022

(86) PCT No.: PCT/KR2022/013935
§ 371 (c)(1),
(2) Date: Jul. 21, 2023

(87) PCT Pub. No.: WO2023/113159
PCT Pub. Date: Jun. 22, 2023

(65) Prior Publication Data
US 2024/0110982 A1    Apr. 4, 2024

(30) Foreign Application Priority Data

Dec. 14, 2021   (KR) .................. 10-2021-0178908

(51) Int. Cl.
*G01R 31/327* (2006.01)
*G01R 19/10* (2006.01)
(Continued)

(52) U.S. Cl.
CPC .......... *G01R 31/3278* (2013.01); *G01R 19/10* (2013.01); *G01R 19/16566* (2013.01); *G01R 31/387* (2019.01)

(58) Field of Classification Search
CPC .. G01R 31/3278; G01R 31/387; G01R 19/10; G01R 19/16566
See application file for complete search history.

(56) References Cited

U.S. PATENT DOCUMENTS 10,622,685 B2   4/2020  Yamamoto et al.
2002/0075004 A1  6/2002  Yudahira et al.
(Continued)

FOREIGN PATENT DOCUMENTS

CN    209342877 U    9/2019
CN    113167833    *   7/2021
(Continued)

OTHER PUBLICATIONS

International Search Report for PCT/KR2022/013935 mailed on Jan. 9, 2023.

*Primary Examiner* — Thang X Le
(74) *Attorney, Agent, or Firm* — Birch, Stewart, Kolasch & Birch, LLP (57) ABSTRACT

An apparatus for diagnosing a main relay that controls connection between a battery pack and a load may comprise a resistor dividing circuit including a plurality of resistors, wherein the resistor dividing circuit is connected between a first main relay connected to a positive terminal of the battery pack and the load and between a first end of a second main relay connected to a negative terminal of the battery pack and a second end of the second main relay, and a diagnosing module connected to the resistor dividing circuit and a voltage source and outputting a relay diagnosis voltage to be used for diagnosing the first main relay and the second main relay.

17 Claims, 11 Drawing Sheets

(51) Int. Cl.
*G01R 19/165* (2006.01)
*G01R 31/387* (2019.01)

(56) References Cited

U.S. PATENT DOCUMENTS

| | | | |
|---|---|---|---|
| 2014/0028322 A1* | 1/2014 | Tzivanopoulos | G01R 31/3277 324/433 |
| 2015/0130469 A1* | 5/2015 | Bolduc | G01R 31/66 324/426 |
| 2015/0346282 A1 | 12/2015 | Jeon | |
| 2018/0240629 A1 | 8/2018 | Ao | |
| 2019/0097438 A1 | 3/2019 | Song et al. | |
| 2020/0011922 A1 | 1/2020 | Yoon et al. | |
| 2020/0049768 A1 | 2/2020 | Matsukawa et al. | |
| 2020/0083732 A1* | 3/2020 | Kim | G01R 19/165 |
| 2020/0217893 A1* | 7/2020 | Song | H01M 10/48 |
| 2021/0102998 A1 | 4/2021 | Azidehak et al. | |
| 2021/0231707 A1 | 7/2021 | Ock et al. | |
| 2021/0359346 A1 | 11/2021 | Ito et al. | |
| 2022/0260637 A1 | 8/2022 | Park | |

FOREIGN PATENT DOCUMENTS

| | | |
|---|---|---|
| CN | 214310793 U | 9/2021 |
| JP | 2002-139522 A | 5/2002 |
| JP | 2018-143042 A | 9/2018 |
| JP | 2018-196285 A | 12/2018 |
| JP | 2019-518212 A | 6/2019 |
| JP | 2021-180545 A | 11/2021 |
| KR | 10-2013-0096481 A | 8/2013 |
| KR | 10-2014-0136844 A | 12/2014 |
| KR | 20140136844 * | 12/2014 |
| KR | 10-2015-0025428 A | 3/2015 |
| KR | 10-1562016 B1 | 11/2015 |
| KR | 10-2015-0137677 A | 12/2015 |
| KR | 10-2019-0004482 A | 1/2019 |
| KR | 10-2019-0034889 A | 4/2019 |
| KR | 10-2032020 B1 | 11/2019 |
| KR | 10-2052956 B1 | 12/2019 |
| KR | 10-2020-0025762 A | 3/2020 |
| KR | 10-2020-0087618 A | 7/2020 |
| KR | 10-2021-0080070 A | 6/2021 |

\* cited by examiner

RELATED ART

<Relay Diagnosis V>

RELAY DIAGNOSIS DEVICE AND RELAY DIAGNOSIS METHOD

TECHNICAL FIELD

This application claims priority to and the benefit of Korean Patent Application No. 10-2021-0178908 filed in the Korean Intellectual Property Office on Dec. 14, 2021, the entire contents of which are incorporated herein by reference.

The present invention relates to an apparatus and a method for diagnosing a relay, and more particularly, to an apparatus and a method for diagnosing a relay using a resistor dividing circuit.

BACKGROUND ART

Secondary batteries are batteries that can be recharged and reused repeatedly. Secondary batteries are typically manufactured as a battery module or a battery pack formed by connecting a plurality of battery cells in series according to an output capacity required by a device to be used as power supply sources for various devices. Such batteries are being used in various fields ranging from small high-tech electronic devices such as smart phones to electric bicycles, electric vehicles (EVs, Light EVs), and energy storage systems (ESS).

A battery module or battery pack is a structure in which a plurality of battery cells are combined. When overvoltage, overcurrent, or overheating occurs in some battery cells, a problem occurs in safety and operating efficiency of the entire battery module or battery pack. Thus, a means for detecting these problems are essential. Accordingly, a battery module or battery pack is equipped with a battery management system (BMS) that measures a voltage value of each battery cell and monitors and controls a voltage state of the battery cells based on measured values.

Power storage systems and high-capacity electric vehicles are often configured by connecting battery packs in parallel to increase capacity. When using battery packs connected in parallel, a problem occurs that a certain area cannot be diagnosed, for example, when a problem occurs in a negative main relay of a certain battery pack, it is impossible to diagnose a state of a negative main relay of other normal battery packs with a conventional diagnosing device.

DETAILED DESCRIPTION OF THE INVENTION

Technical Problem

Embodiments of the present disclosure provide an apparatus for diagnosing a relay using a resistor dividing circuit.

Embodiments of the present disclosure also provide a method for diagnosing a relay using the relay diagnosing apparatus.

Technical Solution

In order to achieve the objective of the present disclosure, an apparatus for diagnosing a main relay that controls connection between a battery pack and a load, the apparatus may comprise: a resistor dividing circuit including a plurality of resistors, wherein the resistor dividing circuit is connected between a first main relay connected to a positive terminal of the battery pack and the load and between a first end of a second main relay connected to a negative terminal of the battery pack and a second end of the second main relay; a diagnosing module connected to the resistor dividing circuit and a voltage source and configured to output a relay diagnosis voltage to be used for diagnosing a state of the first main relay and the second main relay; and a controller configured to diagnose an operation abnormality of at least one of the first main relay and the second main relay according to the relay diagnosis voltage output from the diagnosis module.

Here, the diagnosing module may be a common mode voltage differential amplifier.

The diagnosing module may comprise: a first input unit; a second input unit; a reference voltage input unit; and an output unit configured to output a reference voltage corresponding to a difference between a first input voltage input through the first input unit and a second input voltage input through the second input unit.

The controller may determine as the operation abnormality that an error has occurred in at least one of the first main relay and the second main relay when the relay diagnosis voltage is greater than or equal to a first threshold or less than or equal to a second threshold.

The first threshold and the second threshold may be determined based on the reference voltage.

The output unit may output a relay diagnosis voltage value between the first threshold and the second threshold based on the reference voltage in the instance that there is no difference between the first input voltage and the second input voltage.

The controller may determine that there is no abnormality in the first main relay or the second main relay when the relay diagnosis voltage has a value between the first threshold value and the second threshold value based on the reference voltage.

The operation abnormality may include a state in which at least one of the first main relay and the second main relay is stuck closed.

The output unit may output a value determined according to the difference between the first input voltage and the second input voltage in the instance that the difference between the first input voltage and the second input voltage is greater than a predetermined range.

The plurality of resistors of the resistor dividing circuit may include: a first resistance element and a second resistance element disposed in parallel with a resistor for discharge between a connection part of the first main relay and the load and a connection part of the second main relay and the load; and a third resistance element having a first end connected between the first resistance element and the second resistance element, wherein the first end of the third resistance element is directly or indirectly connected to the first input unit of the diagnosing module and a second end of the third resistance element is directly or indirectly connected to the second input unit of the diagnosis module.

The resistor dividing circuit may further include a diagnosis control switch having a first end connected to a voltage source and a second end connected to the resistor dividing circuit to control voltage application to the resistor dividing circuit.

According to another embodiment of the present disclosure, a method for diagnosing a main relay using a resistor dividing circuit and a diagnosing module connected to the resistor dividing circuit and a voltage source, the resistor dividing circuit including a plurality of resistors connected between a first main relay and a second main relay that controls connection between a battery pack and a load, the method may comprise: turning on a diagnosis control switch in the resistor dividing circuit according to a relay diagnosing request; receiving, from the diagnosis module, a relay diagnosis voltage value output; and diagnosing whether at least one of the first main relay and the second main relay is in a stuck closed state according to the relay diagnosis voltage.

The diagnosing module may comprise: a first input unit; a second input unit; a reference voltage input unit; and an output unit, and the method may further comprise outputting, via the output unit, a reference voltage corresponding to a difference between a first input voltage input through the first input unit and a second input voltage input through the second input unit.

The diagnosing whether at least one of the first main relay and the second main relay is in a stuck closed state may include determining that an error has occurred in at least one of the first main relay and the second main relay when the relay diagnosis voltage is greater than or equal to a first threshold or less than or equal to a second threshold, wherein the first threshold and the second threshold are determined based on the reference voltage and according to characteristics of components or circuits included in the apparatus for diagnosing a main relay.

Furthermore, the diagnosing whether at least one of the first main relay and the second main relay is in a stuck closed state may include determining that there is no abnormality in the first main relay or the second main relay when the relay diagnosis voltage has a value between the first threshold value and the second threshold value based on the reference voltage.

The resistor dividing circuit may include a first resistance element and a second resistance element disposed in parallel with a resistor for discharge between a connection part of the first main relay and the load and a connection part of the second main relay and the load and a third resistance element having one end connected between the first resistance element and the second resistance element, wherein the one end of the third resistance element is directly or indirectly connected to the first input unit of the diagnosing module and the other end of the third resistance element is directly or indirectly connected to the second input unit of the diagnosis module.

Advantageous Effects

According to embodiments of the present disclosure, it is possible to diagnose a case where a relay is stuck closed in all situations using a simpler circuit and a method compared to an existing diagnosing device in a parallel battery pack system.

BEST MODE

The present invention may be modified in various forms and have various embodiments, and specific embodiments thereof are shown by way of example in the drawings and will be described in detail below. It should be understood, however, that there is no intent to limit the present invention to the specific embodiments, but on the contrary, the present invention is to cover all modifications, equivalents, and alternatives falling within the spirit and technical scope of the present invention. Like reference numerals refer to like elements throughout the description of the figures.

It will be understood that, although the terms such as first, second, A, B, and the like may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes combinations of a plurality of associated listed items or any of the plurality of associated listed items.

It will be understood that when an element is referred to as being "coupled" or "connected" to another element, it can be directly coupled or connected to the other element or an intervening element may be present. In contrast, when an element is referred to as being "directly coupled" or "directly connected" to another element, there is no intervening element present.

The terms used herein is for the purpose of describing specific embodiments only and are not intended to limit the present invention. As used herein, the singular forms "a", "an" and "the" are intended to include the plural forms as well, unless the context clearly indicates otherwise. It will be further understood that the terms "comprises", "comprising", "includes", "including" and/or "having", when used herein, specify the presence of stated features, integers, steps, operations, constitutional elements, components and/or combinations thereof, but do not preclude the presence or addition of one or more other features, integers, steps, operations, constitutional elements, components, and/or combinations thereof.

Unless otherwise defined, all terms used herein, including technical and scientific terms, have the same meanings as commonly understood by one skilled in the art to which the present invention belongs. It will be further understood that terms, such as those defined in commonly used dictionaries, should be interpreted as having meanings that are consistent with their meanings in the context of the relevant art and will not be interpreted in an idealized or overly formal sense unless expressly so defined herein.

Hereinafter, exemplary embodiments of the present invention will be described in detail with reference to the accompanying drawings.

Figure 1:
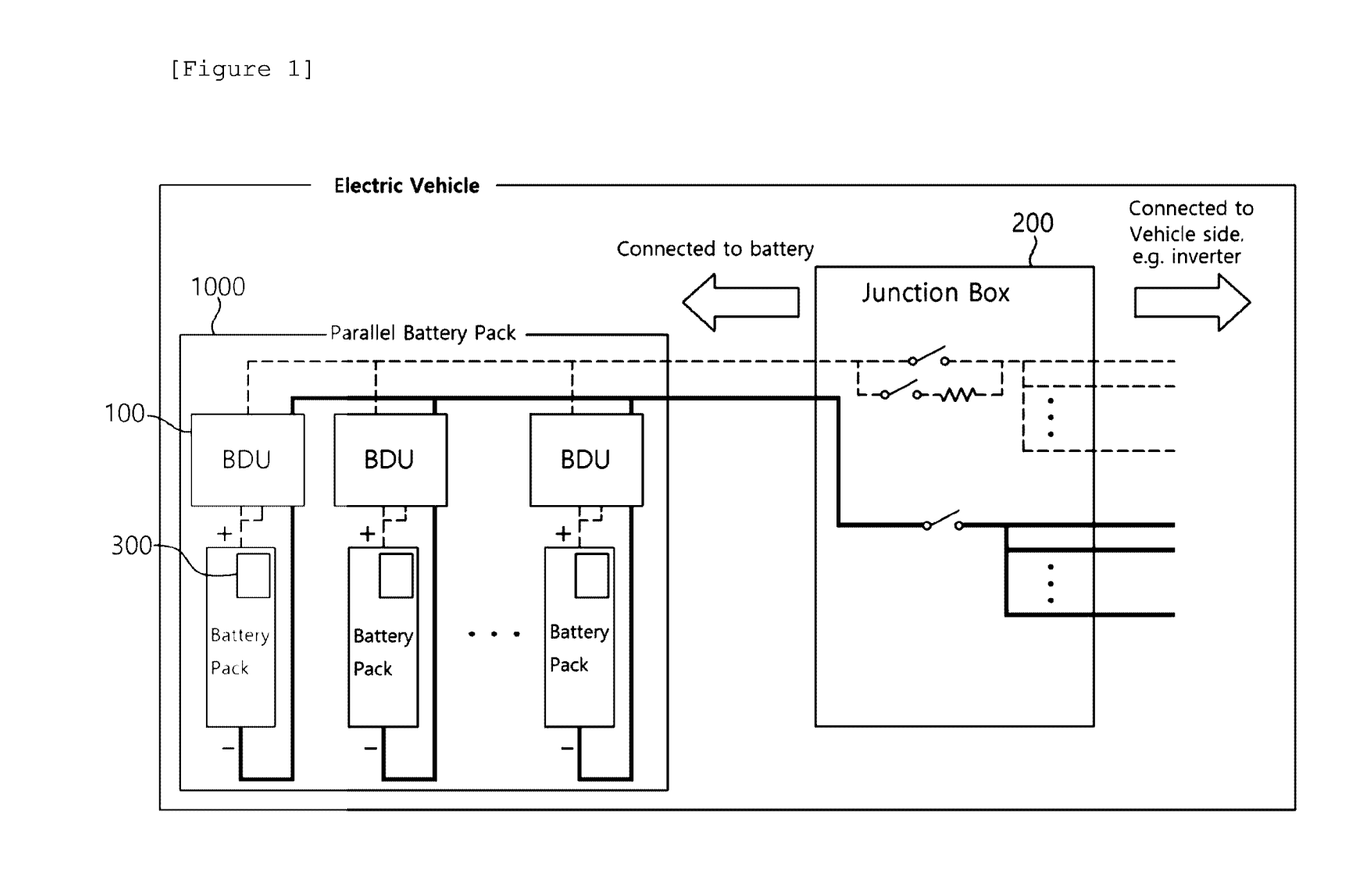
FIG. 1 shows a structure of a battery system according to embodiments of the present invention.

FIG. 1 shows a structure of a battery system according to embodiments of the present invention.

Referring to FIG. 1, a battery system considered in embodiments of the present invention has a form 1000 in which a plurality of battery packs are connected in parallel. Each battery pack may include a plurality of battery cells connected in series. The battery pack may be connected to a load through a positive terminal and a negative terminal to perform charging or discharging. In an embodiment of the present invention, a device including a battery system and a load may be an electric vehicle.

More specifically, a battery management system (BMS) 300 may be installed in each battery pack. The BMS may monitor a current, a voltage and a temperature of each battery pack to be managed, calculate a state of charge (SOC) of the battery based on monitoring results to control charging and discharging. Here, the State of Charge (SOC) refers to a current state of charge of a battery, represented in percent points [%], and the State of Health (SOH) may be a current condition of a battery compared to its ideal conditions, represented in percent points [%].

Each battery pack is connected to an individual BDU (Battery Disconnect Unit) 100 and the BDU may include a positive main relay, a negative main relay, and a pre-charge circuit (including a relay and a resistor). The pre-charge circuit serves as an initial charge circuit. The main relay connected in parallel with the pre-charge circuit is configured to be closed to form a charge/discharge circuit during normal charge/discharge after an initial charge is completed.

The battery packs 1000 connected in parallel are connected to other components in the vehicle that includes a load, e.g., an inverter, through a junction box 200. The junction box 200 interworking with a plurality of BDUs may include a positive main relay, a negative main relay, and a pre-charge circuit (including a relay and a resistor) and a current sensor. The junction box may also be connected with an upper BMS that manages the entire parallel battery packs, provide information on a pack current and a pack voltage to a corresponding BMS, and receive a relay control signal from the corresponding BMS.

Figure 2:
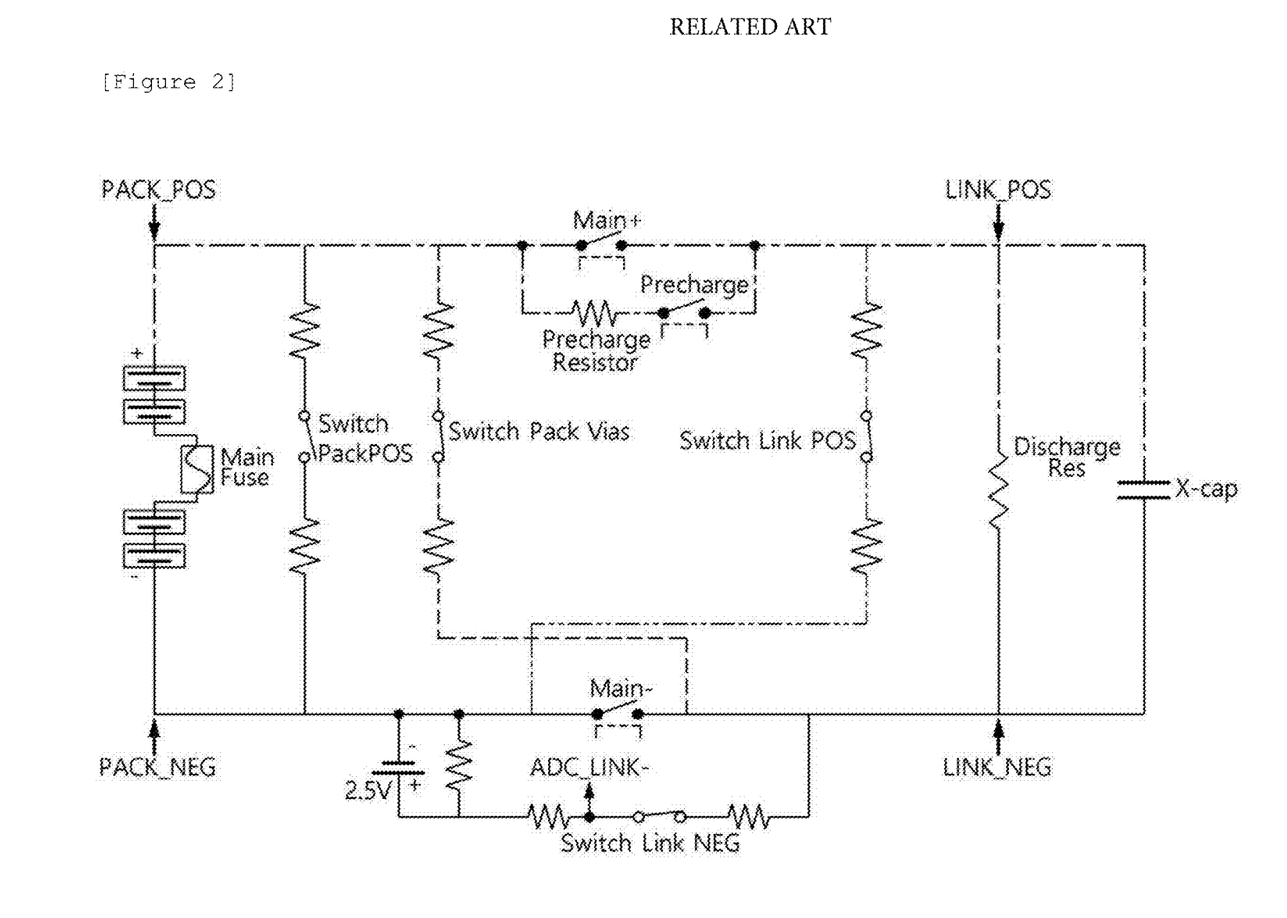
FIG. 2 is a configuration diagram of a typical relay diagnosing circuit.

FIG. 2 is a configuration diagram of a typical relay diagnosing circuit.

As discussed earlier, each battery pack includes a BDU that connects or disconnects power between the battery and the load, and the BDU includes a positive main relay (Main+Relay), a negative main relay (Main−Relay), and a pre-charge circuit (including a relay and a resistor). The pre-charge circuit serves as an initial charge circuit. The main relay connected in parallel with the pre-charge circuit is configured to be closed to form a charge/discharge circuit during normal charge/discharge after the initial charge is completed.

BDU operation modes can be largely divided into a precharging mode, a discharging mode, and a charging mode. The precharging mode is a mode in which a capacitor is initially charged through a precharging relay to prevent damage to an inverter due to high voltage inrush current when the relay is driven. The discharging mode is a mode in which the main relay drives and supplies high power to the inverter, and the charging mode is a mode in which a fast charge relay operates and rapidly charges with DC voltage.

FIG. 2 is a commonly used circuit for diagnosing positive and negative main relays in conventional battery systems. PACK_POS represents a battery side based on a positive main relay and LINK_POS represents a load (e.g. robot, vehicle) side based on the positive main relay. In addition, PACK_NEG represents a battery side based on the negative main relay and LINK_NEG represents a load side based on the negative main relay. Additionally, Pack Vias represents a circuit that applies a battery voltage to a negative terminal of the load side.

Referring to FIG. 2, a conventional relay diagnosing circuit includes a battery pack positive (Pos) switch, a pack vias (Vias) switch, a link positive (Pos) switch, a link negative (Neg) switch, a voltage source, and a plurality of resistors. In the conventional relay diagnosing circuit, a state of relay can be diagnosed by applying a battery voltage to the load and measuring a positive voltage of the battery pack, a positive voltage of the load, and a negative voltage of the load.

Figure 3:
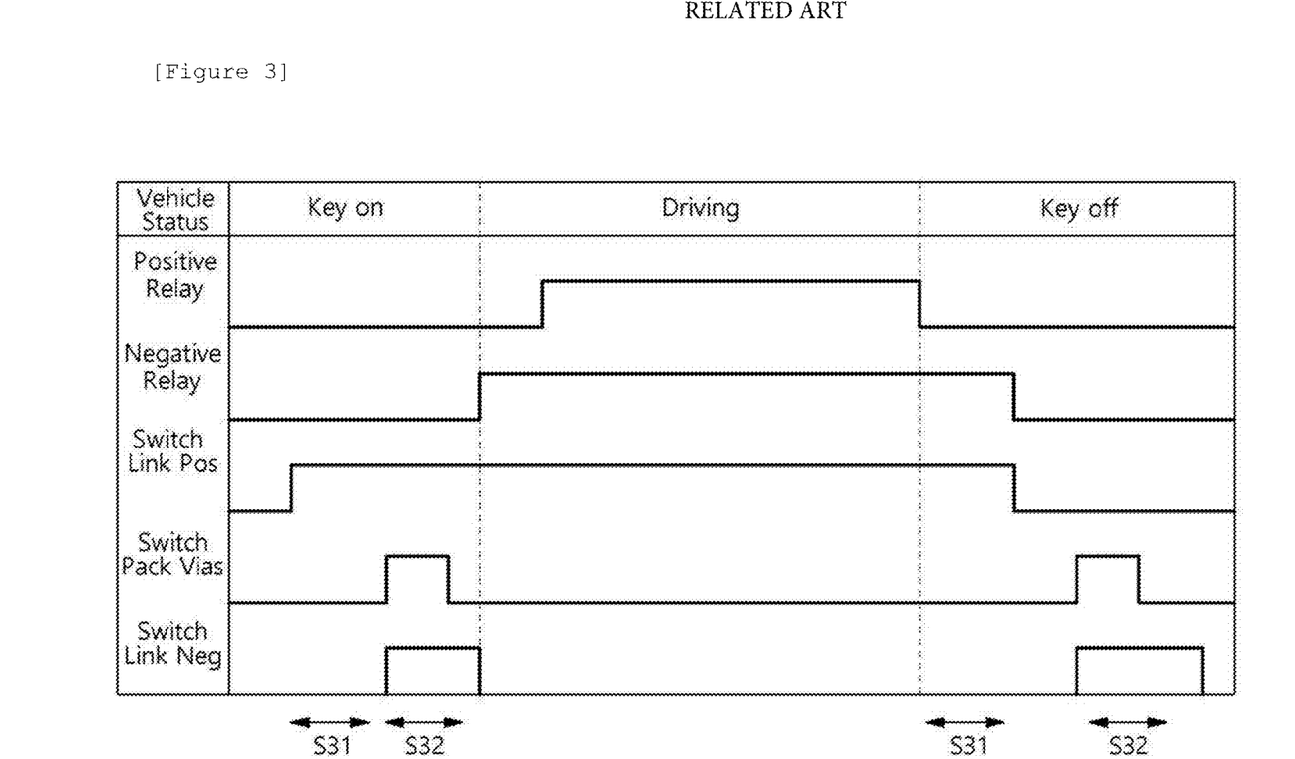
FIG. 3 is a graph showing signals applied to a relay diagnosing circuit for diagnosing a relay.

FIG. 3 is a graph showing signals applied to a relay diagnosing circuit for diagnosing a relay in a typical relay diagnosing circuit.

FIG. 3 is presented to explain a method of performing relay diagnosis using a typical relay diagnosing circuit described in FIG. 2, in which diagnosis is performed using separate sequences for a positive main relay and a negative main relay. The graph in FIG. 3 shows that, in a vehicle state flow in which a vehicle state changes from a key on phase through a driving phase to a key off phase, a relay diagnosing signal is input in the key on phase and in the key off phase and a diagnosing signal is output accordingly.

Referring to FIG. 3, it is possible to diagnose a case where the positive main relay is stuck closed in step S31 and a case where the negative main relay is stuck closed in step S32.

In a diagnosing sequence in step S31 for diagnosing the positive main relay, the battery pack positive switch is turned on to measure a positive voltage (Pack Pos) of the battery pack, and then the load positive switch is turned on subsequently to measure a load positive voltage (Link Pos). Here, it is checked whether an absolute value of the difference between these two measurements (|Pack Pos−Link Pos|) exceeds a certain threshold and the positive main relay can be diagnosed as being in a stuck closed state if the absolute value of the difference exceeds the certain threshold.

In a diagnosing sequence in step S32 for diagnosing the negative main relay, the pack bias switch is turned on to measure a voltage of negative terminal of the load. Here, it is checked whether an absolute value of the negative voltage (|Link Neg|) of the load measured while the pack bias switch is ON is below a certain threshold (e.g. 10V) and the negative main relay can be diagnosed as stuck closed if absolute value of the negative voltage is below the threshold.

In summary, in order to diagnose a stuck-close of the main relay using a typical relay diagnosing circuit, a diagnosing sequence for a positive main relay and a diagnosing sequence for a negative main relay are separately required. In other words, it is impossible to simultaneously diagnose stuck close states of a positive main relay and a negative main relay with a single diagnosing sequence using a typical relay diagnosing circuit.

Figure 4:
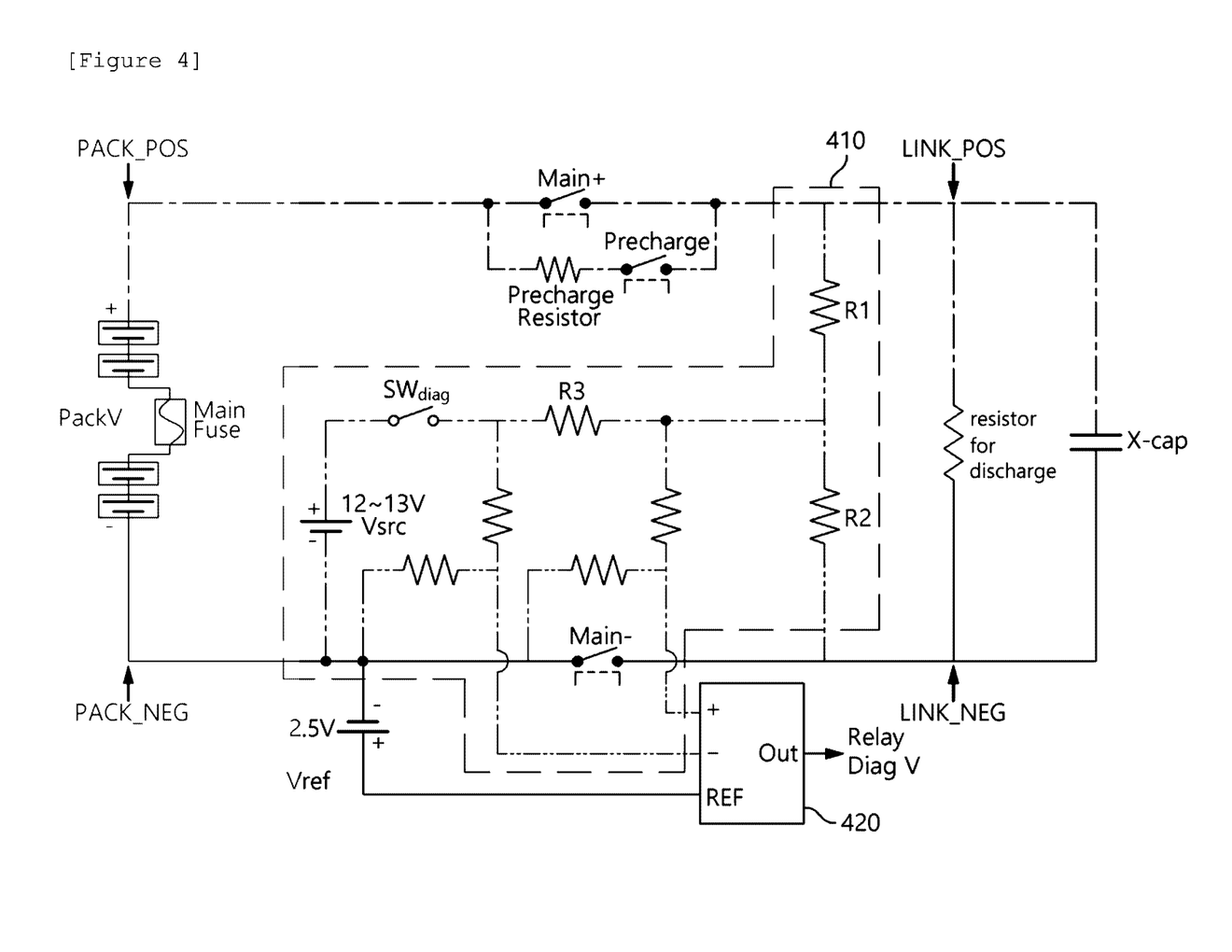
FIG. 4 is a configuration diagram of a relay diagnosing apparatus including a relay diagnosing circuit according to embodiments of the present invention.

FIG. 4 is a configuration diagram of a relay diagnosing apparatus including a relay diagnosing circuit according to embodiments of the present invention.

In FIG. 4, PACK_POS represents a battery side based on a positive main relay, and LINK_POS represents a load (e.g. robot, vehicle) side based on the positive main relay. In addition, PACK_NEG represents a battery side based on a negative main relay, and LINK_NEG represents a load side based on the negative main relay.

Referring to FIG. 4, a relay diagnosing apparatus according to embodiments of the present invention is An apparatus for diagnosing a main relay that controls connection between a battery pack and a load and the apparatus may comprise a resistor dividing circuit 410 including a plurality of resistors connected between a first main relay connected to a positive terminal of the battery pack and the load, and between one end of a second main relay connected to the negative terminal of the battery pack and the other end of the second main relay; a diagnosing module 420 connected to the resistor dividing circuit and a voltage source and configured to output a relay diagnosis voltage used for diagnosing the first main relay and the second main relay; and a controller (not shown) configured to diagnose an operation abnormality of at least one of the first main relay and the second main relay according to the relay diagnosis voltage output from the diagnosis module.

Here, the controller (not shown) may be a micro controller (MCU) that is connected to the resistor dividing circuit and the diagnosing module and controls their operations, and the relay diagnosing apparatus may be included in a battery management system (BMS).

As shown in FIG. 4, the diagnosing module 420 may be a common mode voltage differential amplifier and may include a first input unit (eg, a positive input); a second input unit (eg, negative input); a reference voltage input unit (Ref); and an output unit configured to output a reference voltage or a value that is in accordance with a difference between a first input voltage input through the first input unit and a second input voltage input through the second input unit, according to the difference between the first input voltage and the second input voltage.

The output unit outputs a relay diagnosis voltage value between the first threshold and the second threshold based on the reference voltage in the instance that there is no difference between the first input voltage and the second input voltage.

The controller may determine that there is no abnormality in the first main relay or the second main relay when the relay diagnosis voltage that is output from the output unit has a value between the first threshold value and the second threshold value based on the reference voltage. Here, the operation abnormality of the relay may include a state in which at least one of the first main relay and the second main relay is stuck closed.

Furthermore, the output unit the output unit outputs a value determined according to the difference between the first input voltage and the second input voltage in the instance that the difference between the first input voltage and the second input voltage is greater than a predetermined range. Here, the predetermined range may mean a difference to an extent that it cannot be determined that the first input voltage and the second input voltage are the same value.

In the circuit of FIG. 4, resistance values that affect the derivation of the relay diagnosis voltage value are the resistance values of R1, R2, and R3.

The resistor dividing circuit 410 may a first resistance element (R1) and a second resistance element (R2) disposed in parallel with a resistor for discharge between a connection part of the first main relay and the load and a connection part of the second main relay and the load; and a third resistance element having one end connected between the first resistance element and the second resistance element. The one end of the third resistance element is indirectly (via one or more intermediate resistance elements located between one end of the third resistance element and the diagnosing module) connected to the first input unit of the diagnosing module and the other end of the third resistance element is indirectly (via one or more intermediate resistance elements located between the other end of the third resistance element and the diagnosing module) connected to the second input unit of the diagnosing module.

The first input and the second input of the diagnosing module 420 may be determined according to a voltage value applied to the R3 resistance element in the resistor dividing circuit. When diagnosing a main relay through the diagnosing circuit of FIG. 4, a diagnosis control switch (SWdiag) is turned on to apply a voltage (12 to 13V) to the resistor dividing circuit. It can be checked whether a positive main relay or a negative main relay is stuck closed by analyzing an output value of the diagnosing module which is a relay diagnosis voltage value and varies depending on a voltage applied to a specific resistor (R3 in FIG. 4) in the resistor dividing circuit connected to a battery pack, a positive main relay and a negative main relay.

Figure 5:
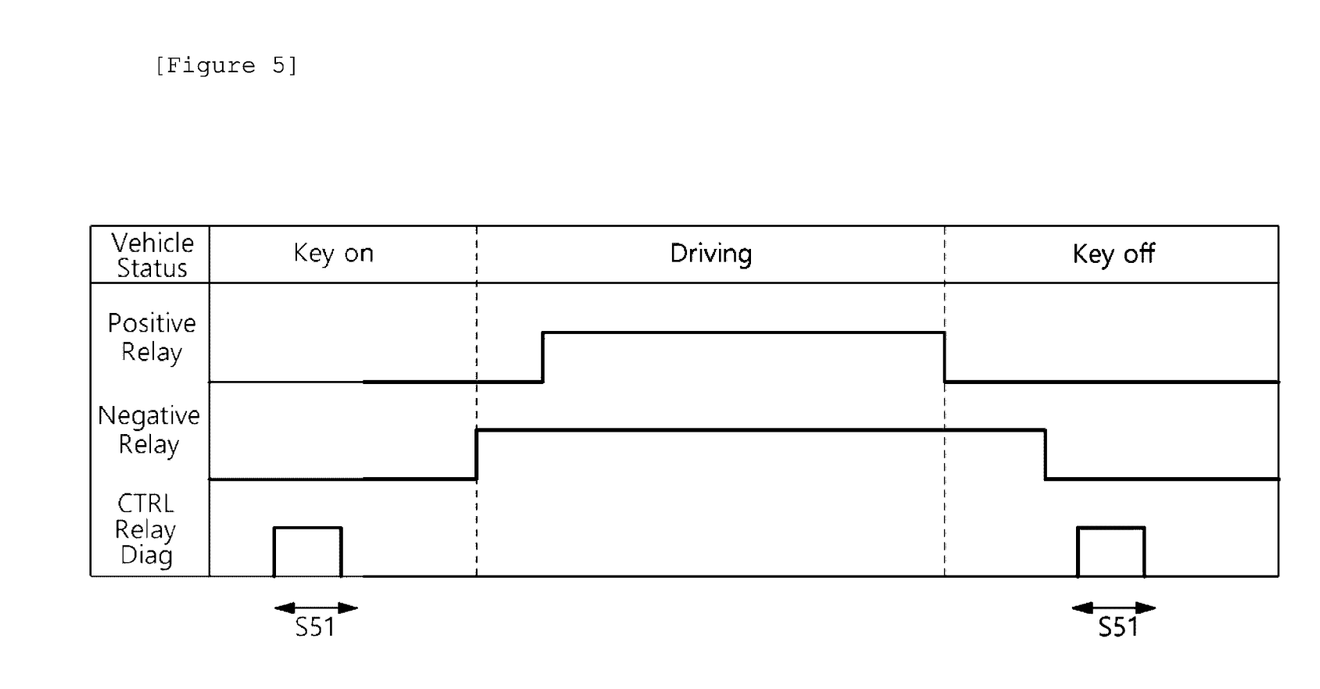
FIG. 5 is a graph showing signals applied to a relay diagnosing circuit for diagnosing a relay according to embodiments of the present invention.

FIG. 5 is a graph showing signals applied to a relay diagnosing circuit for diagnosing a relay according to embodiments of the present invention.

When a controller (for example, MCU) of the relay diagnosis device of the present invention intends to diagnose a main relay, the diagnosis control switch located between a voltage source and the resistor dividing circuit is turned on to apply a voltage to the resistor dividing circuit. Accordingly, states of the main relays can be diagnosed by analyzing a relay diagnosis voltage output by the diagnosing module.

Referring to FIG. 5, when the diagnosis control switch becomes on, a relay diagnosis control (CTRL Relay Diag.) signal is applied to the resistor dividing circuit. The relay diagnosis control signal may be applied when the vehicle state is not driving. A relay diagnosis section S51 is shown in the key-on state and in the key-off state in FIG. 5. In the present invention, procedures for diagnosing the positive main relay and the negative main relay are not separated, and at least one of the positive main relay and the negative main relay can be diagnosed using the same diagnosing procedure. A relay diagnosis apparatus according to embodiments of the present invention may be a battery management system (BMS) interworking with each battery pack or may be a device included in the BMS.

Figure 6:
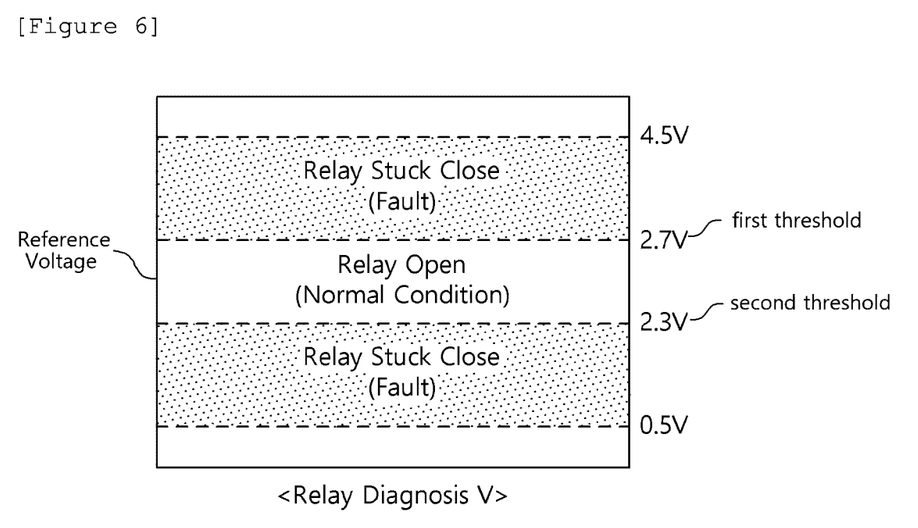
FIG. 6 is a diagram for showing a concept of diagnosing a relay according to embodiments of the present invention.

FIG. 6 is a diagram for showing a concept of diagnosing a relay according to embodiments of the present invention.

As described above, the relay diagnosing apparatus according to the present invention may diagnose an operation abnormality of one or more of the first main relay and the second main relay according to a relay diagnosis voltage (Relay Diagnosis V) output from the diagnosing module. Here, when the relay diagnosis voltage is equal to or greater than a first threshold or equal to or less than a second threshold, the relay diagnosing apparatus (i.e., the controller) may be determined that an error has occurred in the first main relay or the second main relay.

Here, the first threshold and the second threshold are values for defining a predetermined variation range (margin) centered on a reference voltage Vref input to the diagnosing module, wherein the first threshold and the second threshold vary depending on characteristics of components or circuits included in the relay diagnosing circuit.

FIG. 6 illustrates a method for diagnosing a relay in the same circuit as the diagnosing circuit in FIG. 4, and accordingly, the reference voltage becomes 2.5V as same as the example in FIG. 4. The first threshold is set to 2.7V, and the second threshold is set to 2.3V. The voltage range defined in between the first threshold and the second threshold represents voltage values that can be considered that the diagnosing module outputs a reference voltage. Here, the voltage range may be set so as to reflect output values of the diagnosing module that can vary depending on circuit characteristics such as various noises generated from circuits or devices.

In addition, the upper limit value of 4.5V and the lower limit value of 0.5V are output values of the diagnosing module that may appear according to resistance elements included in the resistor dividing circuit, which are the highest and lowest values of the relay diagnosis voltage value. The voltage values shown in FIG. 6 are values derived by assuming that the resistance values of the resistor dividing circuit according to the present invention are, for example, R1=50 KΩ, R2=200 KΩ, and R3=5 KΩ.

A derivation procedure of the relay diagnosis voltage value will be described in more detail with reference to FIGS. 7A to 7C and FIGS. 8A to 8C.

Figure 7A:
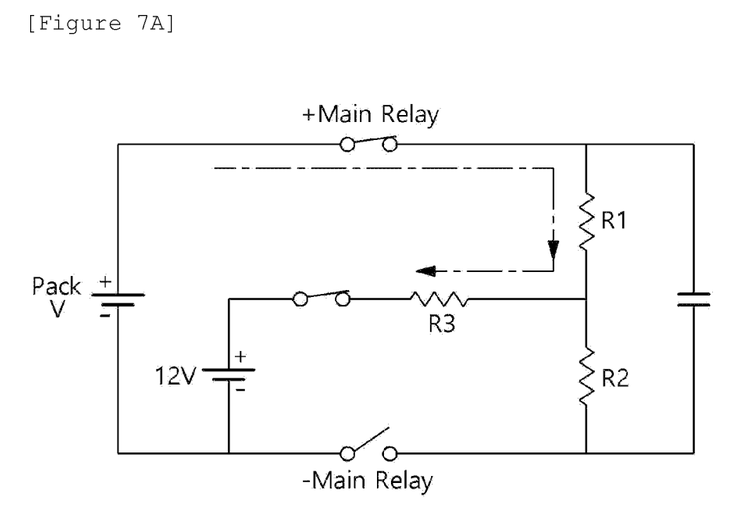
FIGS. 7A to 7C are schematic circuit diagrams that are used to derive a relay diagnosis voltage value in a single pack battery system according to embodiments of the present invention.
Figure 7B:
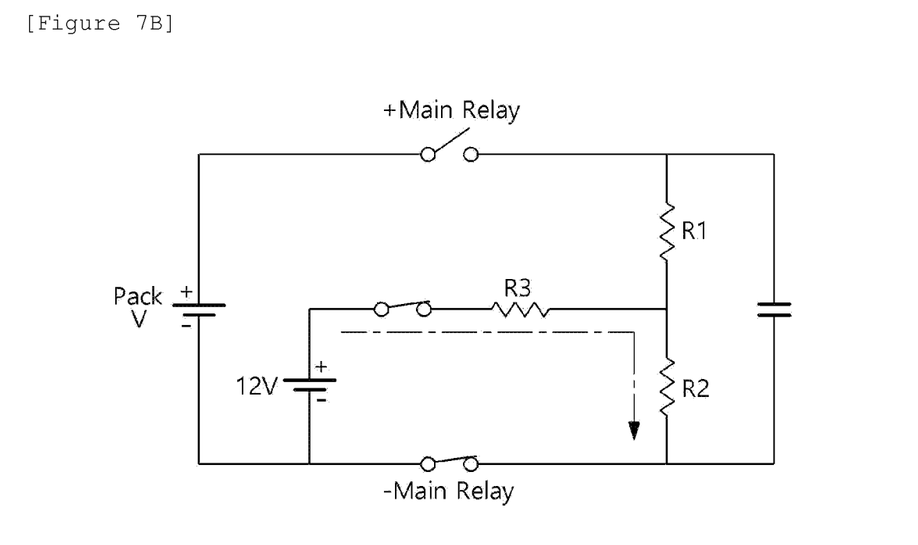
Figure 7C:
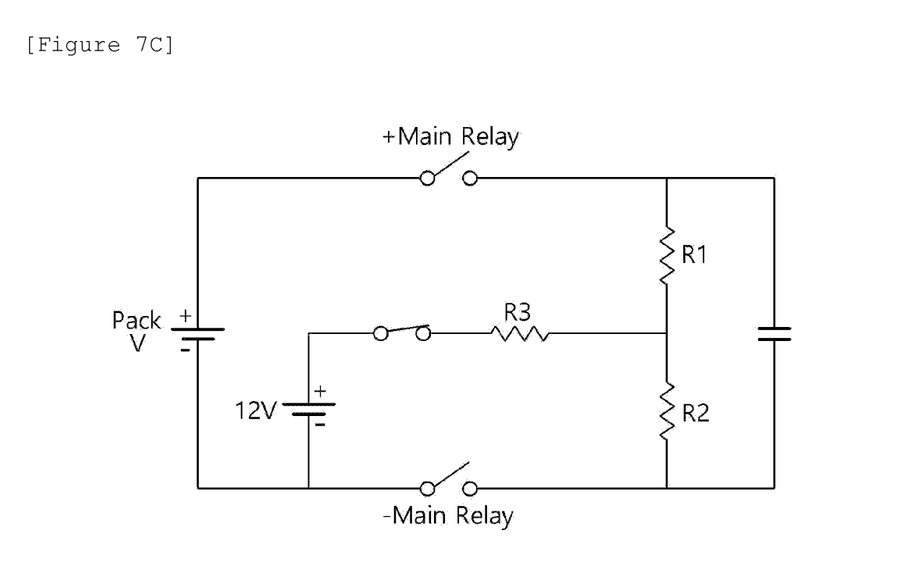

FIGS. 7A to 7C are schematic circuit diagrams that are used to derive a relay diagnosis voltage in a single pack battery system according to embodiments of the present invention.

FIGS. 7A to 7C show current flows in a relay diagnosing circuit in a system including one battery pack. A voltage applied to the resistance element R3 becomes a voltage difference between the first input and the second input of the diagnosing module 420 in FIG. 4.

FIG. 7A is a simplified circuit diagram of a case where a positive main relay is stuck closed, in which circuit current flows through R1 and R3. FIG. 7B is a simplified circuit diagram of a case in which a negative main relay is stuck closed and the circuit current flows through R1 and R2. FIG. 7C is a simplified circuit diagram in case that both the positive main relay and the negative main relay are normally open.

Assuming that the resistance element values of the resistor dividing circuit according to the present invention are, for example, R1=50 KΩ, R2=200 KΩ, R3=5 KΩ and the battery pack voltage is 42V to 60V, the relay diagnosis voltage value in the circuit of FIG. 7A may vary depending on the battery pack voltage and it becomes 3.0V to 4.5V. Furthermore, in the circuit of FIG. 7B, the relay diagnosis voltage value may be in between 1.2V and 2.3V. In the circuit of FIG. 7C, since the current does not flow through the resistance element R3, the output value of the diagnosing module follows the reference voltage value Vref, and thus the relay depending voltage value becomes 2.5V.

Figure 8A:
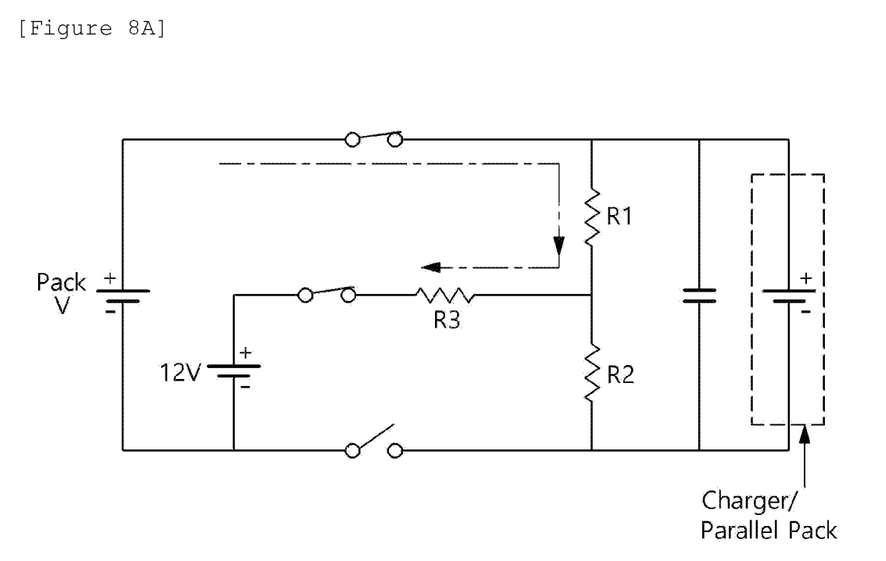
FIGS. 8A to 8C are schematic circuit diagrams that may be used to calculate a relay diagnosis voltage value in a system including a plurality of parallel battery packs or chargers according to embodiments of the present invention.
Figure 8B:
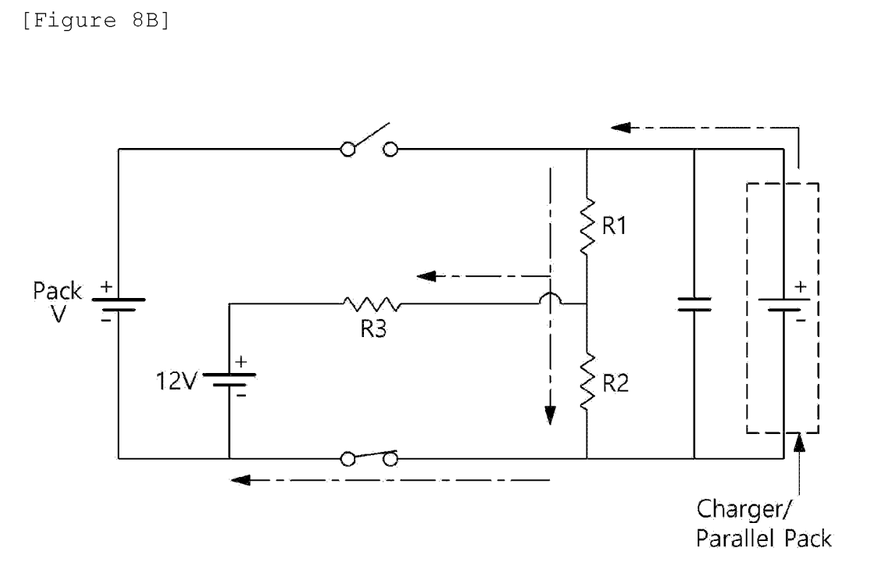
Figure 8C:
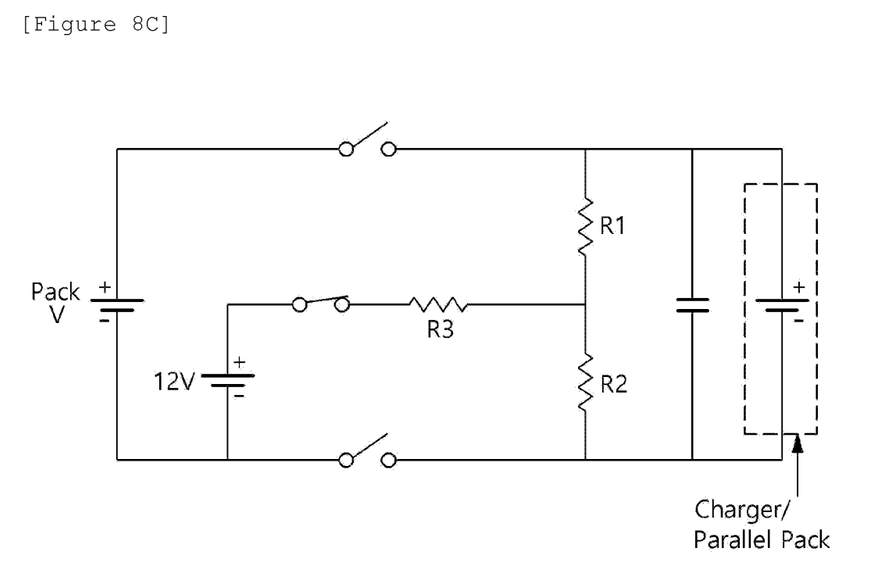

FIGS. 8A to 8C are schematic circuit diagrams that may be used to calculate a relay diagnosis voltage value in a system including a plurality of parallel battery packs or chargers according to embodiments of the present invention.

FIGS. 8A to 8C show current flows in a relay diagnosing circuit in a system including a plurality of parallel battery packs or chargers. Compared to a system including a single battery pack, the difference is that a charger or one or more battery packs are additionally placed in parallel. Even in this case, the voltage applied to the resistance element R3 becomes the voltage difference between the first input and the second input of the diagnosing module 420.

FIG. 8A is a simplified circuit diagram of a case where a positive main relay is stuck closed, in which circuit current flows through R1 and R3. FIG. 8B is a simplified circuit diagram of a case in which a negative main relay is stuck closed and the circuit current flows through R1, R2 and R3. In addition, FIG. 8C is a simplified circuit diagram in a case that both the positive main relay and the negative main relay are normally open.

Assuming that the resistance element values of the resistor dividing circuit according to the embodiment are, for example, R1=50 KΩ, R2=200 KΩ, R3=5 KΩ and the battery pack voltage is 42V to 60V, the relay diagnosis voltage value in the circuit of FIG. 8A may vary depending on the battery pack voltage and it becomes approximately 3.0V to 4.5V. Furthermore, in the circuit of FIG. 8B, the relay diagnosis voltage value may become 3.0V to 4.5V. In the circuit of FIG. 8C, since the current does not flow through the resistance element R3, the output value of the diagnosing module follows the reference voltage value Vref, and thus the relay depending voltage value becomes 2.5V.

Figure 9:
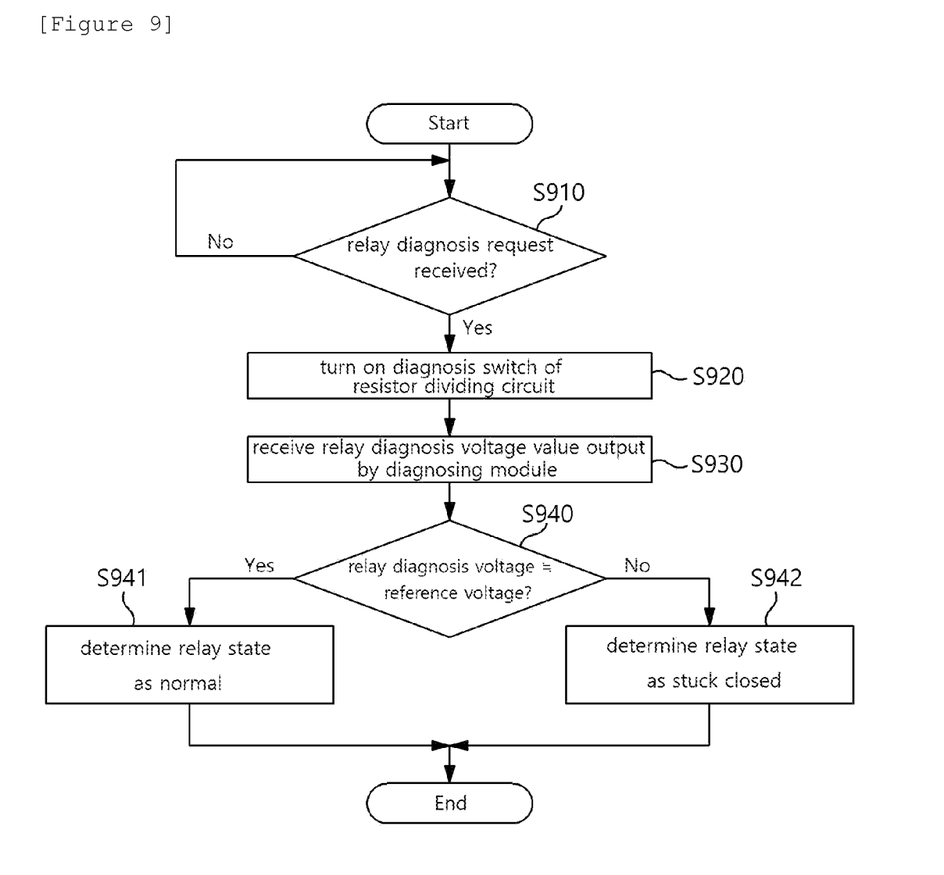
FIG. 9 is an operational flowchart of a method for diagnosing a relay according to embodiments of the present invention.

FIG. 9 is an operational flowchart of a method for diagnosing a relay according to embodiments of the present invention.

A method for diagnosing a relay according to embodiments of the present invention may be a method for diagnosing a main relay using a resistor dividing circuit and a diagnosing module connected to the resistor dividing circuit and a voltage source and configured to output a relay diagnosis voltage, wherein the resistor dividing circuit includes a plurality of resistors connected between a first main relay and a second main relay that controls connection between a battery pack and a load.

The diagnosing module may include a first input unit; a second input unit; a reference voltage input unit; and an output unit configured to output a reference voltage or a value that is in accordance with a difference between a first input voltage input through the first input unit and a second input voltage input through the second input unit, according to the difference between the first input voltage and the second input voltage.

In addition, the resistor dividing circuit may include a first resistance element and a second resistance element disposed in parallel with a resistor for discharge between a connection part of the first main relay and the load and a connection part of the second main relay and the load and a third resistance element having one end connected between the first resistance element and the second resistance element, wherein the one end of the third resistance element is directly or indirectly connected to the first input unit of the diagnosing module and the other end of the third resistance element is directly or indirectly connected to the second input unit of the diagnosing module.

The method for diagnosing a relay according to embodiments of the present invention may be performed by a relay diagnosing apparatus or a controller in the relay diagnosing apparatus, for example, various MCUs, processors, and controllers that may be included in a BMS, but the subject of operation is limited to them.

Upon receiving a relay diagnosis request from a user or an internal/external system (S910), the controller in the relay diagnosing apparatus turns on a diagnosis switch of a resistor dividing circuit (S920).

As the diagnosing switch is turned on, the controller may receive a relay diagnosis voltage output by the diagnosing module (S930) and diagnose whether at least one of the first main relay and the second main relay is in a stuck closed state according to the relay diagnosis voltage value (S940, S941, S942).

Specifically, the controller compares the diagnosing voltage value to a reference voltage value (S940). The controller determines the relay state as normal when the diagnosing voltage value almost coincides with the reference voltage (S941) and the controller determines the relay state as abnormal, that is, stuck closed when the two values do not match (S942).

In other words, the controller may determine that an error has occurred in at least one of the first main relay and the second main relay when the relay diagnosis voltage is greater than or equal to a first threshold or less than or equal to a second threshold. Here, the first threshold and the second threshold are determined based on the reference voltage and according to characteristics of components or circuits included in the apparatus for diagnosing a main relay.

The controller may determine that there is no abnormality in the first main relay or the second main relay when the relay diagnosis voltage has a value between the first threshold value and the second threshold value based on the reference voltage.

The operations of the method according to the embodiments of the present invention may be implemented as a computer-readable program or code on a computer-readable recording medium. The computer-readable recording medium includes all types of recording devices in which data readable by a computer system is stored. In addition, the computer-readable recording medium may be distributed in a network-connected computer system to store and execute computer-readable programs or codes in a distributed manner.

Although some aspects of the invention have been described in the context of the apparatus, it may also represent a description according to a corresponding method, wherein a block or apparatus corresponds to a method step or feature of a method step. Similarly, aspects described in the context of a method may also represent a feature of a corresponding block or item or a corresponding apparatus. Some or all of the method steps may be performed by (or using) a hardware device, such as, for example, a microprocessor, a programmable computer, or an electronic circuit. In some embodiments, one or more of the most important method steps may be performed by such an apparatus.

In the forgoing, the present invention has been described with reference to the exemplary embodiment of the present invention, but those skilled in the art may appreciate that the present invention may be variously corrected and changed within the range without departing from the spirit and the area of the present invention described in the appending claims.

The invention claimed is:

1. An apparatus for diagnosing a main relay that controls connection between a battery pack and a load, the apparatus comprising:
   a resistor dividing circuit including a plurality of resistors, wherein the resistor dividing circuit is connected between a first main relay connected to a positive terminal of the battery pack and the load, and between a first end of a second main relay connected to a negative terminal of the battery pack and a second end of the second main relay;
   a diagnosing module connected to the resistor dividing circuit and a first voltage source, and configured to output a relay diagnosis voltage to be used for diagnosing a state of the first main relay and the second main relay; and
   a controller,
   wherein the diagnosing module comprises a first input unit configured to receive a first input voltage, a second input unit configured to receive a second input voltage, a reference voltage input unit, and an output unit configured to output a voltage corresponding to a difference between the first input voltage input through the first input unit and the second input voltage input through the second input unit, and
   wherein the controller is configured to diagnose an operation abnormality of at least one of the first main relay and the second main relay according to the relay diagnosis voltage output from the diagnosing module.

2. The apparatus of claim 1, wherein the diagnosing module further comprises a common mode voltage differential amplifier.

3. The apparatus of claim 1, wherein the controller is configured to determine as the operation abnormality that an error has occurred in at least one of the first main relay and the second main relay when the relay diagnosis voltage is greater than or equal to a first threshold or less than or equal to a second threshold.

4. The apparatus of claim 3, wherein the first threshold and the second threshold are determined based on a reference voltage.

5. The apparatus of claim 1, wherein the output unit is configured to output a relay diagnosis voltage value between a first threshold and a second threshold based on a reference voltage when there is no difference between the first input voltage and the second input voltage.

6. The apparatus of claim 5, wherein the controller is configured to determine that there is no abnormality in the first main relay or the second main relay when the relay diagnosis voltage value is between the first threshold and the second threshold based on the reference voltage.

7. The apparatus of claim 1, wherein the operation abnormality includes a state in which at least one of the first main relay and the second main relay is stuck closed.

8. The apparatus of claim 1, wherein the output unit is configured to output a value determined according to the difference between the first input voltage and the second input voltage when the difference between the first input voltage and the second input voltage is greater than a predetermined range.

9. The apparatus of claim 1, wherein the plurality of resistors of the resistor dividing circuit include:
   a first resistance element and a second resistance element disposed in parallel with a resistor for discharge between a connection part of the first main relay and the load and a connection part of the second main relay and the load; and
   a third resistance element having a first end connected between the first resistance element and the second resistance element,
   wherein the first end of the third resistance element is directly or indirectly connected to the first input unit of the diagnosing module and a second end of the third resistance element is directly or indirectly connected to the second input unit of the diagnosing module.

10. The apparatus of claim 1, wherein the resistor dividing circuit further includes:
    a diagnosis control switch having a first end connected to a second voltage source and a second end connected to the resistor dividing circuit to control voltage application to the resistor dividing circuit.

11. The apparatus of claim 1, wherein the plurality of resistors of the resistor dividing circuit include:
    a first resistor having an end connected to the positive terminal of the battery pack;
    a second resistor having an end connected to the negative terminal of the battery pack; and
    a third resistor configured to have a voltage applied thereto, the third resistor being connected in parallel to the first resistor and the second resistor.

12. The apparatus of claim 11, wherein the voltage output by the output unit is configured to vary based on the voltage applied to the third resistor.

13. The apparatus of claim 11, wherein a resistance of the third resistor is smaller than a resistance of the first resistor and a resistance of the second resistor.

14. A method for diagnosing a main relay using a resistor dividing circuit and a diagnosing module connected to the resistor dividing circuit and a voltage source, the resistor dividing circuit including a plurality of resistors connected between a first main relay and a second main relay that controls connection between a battery pack and a load, and the diagnosing module including a first input unit configured to receive a first input voltage, a second input unit configured to receive a second input voltage, a reference voltage input unit, and an output unit, the method comprising:

turning on a diagnosis control switch in the resistor dividing circuit according to a relay diagnosing request;

outputting, via the output unit, a voltage corresponding to a difference between the first input voltage input through the first input unit and the second input voltage through the second input unit;

receiving, from the diagnosing module, a relay diagnosis voltage value; and     diagnosing whether at least one of the first main relay and the second main relay is in a stuck closed state according to the relay diagnosis voltage value.

15. The method of claim 14, wherein the diagnosing whether at least one of the first main relay and the second main relay is in the stuck closed state includes:

determining that an error has occurred in at least one of the first main relay and the second main relay when the relay diagnosis voltage value is greater than or equal to a first threshold or less than or equal to a second threshold,     wherein the first threshold and the second threshold are determined based on the voltage and according to characteristics of components for diagnosing the main relay.

16. The method of claim 14, wherein the diagnosing whether at least one of the first main relay and the second main relay is in the stuck closed state includes:

determining that there is no abnormality in the first main relay or the second main relay when the relay diagnosis voltage value has a value between a first threshold and a second threshold based on the voltage.

17. The method of claim 14, wherein the plurality of resistors of the resistor dividing circuit include:

a first resistance element and a second resistance element disposed in parallel with a resistor for discharge between a connection part of the first main relay and the load and a connection part of the second main relay and the load; and     a third resistance element having a first end connected between the first resistance element and the second resistance element,     wherein the first end of the third resistance element is directly or indirectly connected to the first input unit of the diagnosing module and a second end of the third resistance element is directly or indirectly connected to the second input unit of the diagnosing module.

* * * * *